United States Patent
Balakrishnan et al.

(10) Patent No.: US 10,396,145 B2
(45) Date of Patent: *Aug. 27, 2019

(54) MEMORY CELLS COMPRISING FERROELECTRIC MATERIAL AND INCLUDING CURRENT LEAKAGE PATHS HAVING DIFFERENT TOTAL RESISTANCES

(71) Applicant: Micron Technology, Inc., Boise, ID (US)

(72) Inventors: Muralikrishnan Balakrishnan, Boise, ID (US); Beth R. Cook, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 148 days.

This patent is subject to a terminal disclaimer.

(21) Appl. No.: 15/404,576

(22) Filed: Jan. 12, 2017

(65) Prior Publication Data
US 2018/0197870 A1    Jul. 12, 2018

(51) Int. Cl.
*H01L 27/11507* (2017.01)
*H01L 49/02* (2006.01)

(52) U.S. Cl.
CPC ........ *H01L 28/65* (2013.01); *H01L 27/11507* (2013.01); *H01L 28/75* (2013.01); *H01L 28/91* (2013.01)

(58) Field of Classification Search
CPC combination set(s) only.
See application file for complete search history.

(56) References Cited

U.S. PATENT DOCUMENTS

| | | |
|---|---|---|
| 4,070,653 A | 1/1978 | Rao et al. |
| 6,236,076 B1 | 5/2001 | Arita et al. |
| (Continued) | | |

FOREIGN PATENT DOCUMENTS

| | | |
|---|---|---|
| CN | 1490880 | 4/2004 |
| CN | 102263122 | 11/2011 |
| (Continued) | | |

OTHER PUBLICATIONS

Pandey et al., "Structural, ferroelectric and optical properties of PZT thin films", 2005, Physica B, vol. 368, Nov. 2005; pp. 135-142.

(Continued)

*Primary Examiner* — Matthew E. Gordon
(74) *Attorney, Agent, or Firm* — Wells St. John P.S.

(57) ABSTRACT

A memory cell comprises a capacitor having a first conductive capacitor electrode having laterally-spaced walls that individually have a top surface. A second conductive capacitor electrode is laterally between the walls of the first capacitor electrode, and comprises a portion above the first capacitor electrode. Ferroelectric material is laterally between the walls of the first capacitor electrode and laterally between the second capacitor electrode and the first capacitor electrode. The capacitor comprises an intrinsic current leakage path from one of the first and second capacitor electrodes to the other through the ferroelectric material. A parallel current leakage path is between an elevationally-inner surface of the portion of the second capacitor electrode that is above the first capacitor electrode and at least one of the individual top surfaces of the laterally-spaced walls of the first capacitor electrode. The parallel current leakage path is circuit-parallel the intrinsic current leakage path and of lower total resistance than the intrinsic current leakage path. Other aspects, including methods, are disclosed.

29 Claims, 14 Drawing Sheets

(56) References Cited

U.S. PATENT DOCUMENTS

| | | |
|---|---|---|
| 6,242,299 B1 | 6/2001 | Hickert |
| 6,256,220 B1 | 7/2001 | Kamp |
| 6,339,544 B1 | 1/2002 | Chiang et al. |
| 6,370,056 B1 | 4/2002 | Chen et al. |
| 6,674,109 B1 | 1/2004 | Fujimori et al. |
| 6,717,215 B2 | 4/2004 | Fricke et al. |
| 6,717,838 B2 | 4/2004 | Hosoi |
| 6,862,214 B2 | 3/2005 | Lee et al. |
| 6,885,048 B2 | 4/2005 | Tarui et al. |
| 7,180,141 B2 | 2/2007 | Eliason et al. |
| 7,378,286 B2 | 5/2008 | Hsu et al. |
| 7,525,830 B2 | 4/2009 | Kang |
| 7,558,097 B2 | 7/2009 | Khellah et al. |
| 7,573,083 B2 | 8/2009 | Kijima et al. |
| 7,902,594 B2 | 3/2011 | Mizuki |
| 8,004,871 B2 | 8/2011 | Kaneko et al. |
| 8,021,897 B2 | 9/2011 | Sills et al. |
| 8,026,546 B2 | 9/2011 | Murata et al. |
| 8,304,823 B2 | 11/2012 | Boescke |
| 8,399,874 B2 | 3/2013 | Hwang |
| 8,634,257 B2 | 1/2014 | Hanzawa et al. |
| 8,796,085 B2 | 8/2014 | Koldiaev |
| 9,159,829 B1 | 10/2015 | Ramaswamy |
| 9,276,092 B1 | 3/2016 | Karda |
| 9,305,929 B1 * | 4/2016 | Karda ............... H01L 27/11507 |
| 9,559,118 B2 | 1/2017 | Karda et al. |
| 2001/0039091 A1 | 11/2001 | Nakagawa |
| 2002/0036313 A1 | 3/2002 | Yang et al. |
| 2002/0102808 A1 | 8/2002 | Pu et al. |
| 2002/0125536 A1 | 9/2002 | Iwasa et al. |
| 2003/0001189 A1 | 1/2003 | Fujiwara et al. |
| 2003/0006446 A1 | 1/2003 | Forbes et al. |
| 2003/0021479 A1 | 1/2003 | Oku |
| 2003/0075753 A1 | 4/2003 | Chu et al. |
| 2003/0183936 A1 | 10/2003 | Ito et al. |
| 2004/0002176 A1 | 1/2004 | Xu |
| 2004/0004240 A1 | 1/2004 | Nishikawa |
| 2004/0036111 A1 | 2/2004 | Nishikawa et al. |
| 2004/0070017 A1 | 4/2004 | Yang et al. |
| 2004/0090815 A1 | 5/2004 | Tajiri |
| 2004/0173874 A1 | 9/2004 | Saigoh |
| 2004/0266045 A1 | 12/2004 | Mears et al. |
| 2005/0237779 A1 | 10/2005 | Kang |
| 2005/0282296 A1 | 12/2005 | Hsu et al. |
| 2006/0014307 A1 | 1/2006 | Kweon |
| 2006/0118841 A1 | 6/2006 | Eliason et al. |
| 2006/0124987 A1 | 6/2006 | Won et al. |
| 2006/0181918 A1 | 8/2006 | Shin et al. |
| 2007/0035984 A1 | 2/2007 | Arai |
| 2007/0108524 A1 | 5/2007 | Ito et al. |
| 2007/0236979 A1 | 10/2007 | Takashima |
| 2007/0272960 A1 | 11/2007 | Hsu et al. |
| 2007/0285970 A1 | 12/2007 | Toda et al. |
| 2008/0182358 A1 | 7/2008 | Cowdery-Corvan et al. |
| 2008/0191267 A1 | 8/2008 | Shin |
| 2008/0217600 A1 | 9/2008 | Gidon |
| 2008/0225569 A1 | 9/2008 | Nawano |
| 2008/0265235 A1 | 10/2008 | Kamigaichi et al. |
| 2009/0029513 A1 | 1/2009 | Blanchard |
| 2009/0045390 A1 | 2/2009 | Rinerson et al. |
| 2009/0095950 A1 | 4/2009 | Lieber et al. |
| 2009/0141547 A1 | 6/2009 | Jin |
| 2009/0209051 A1 | 8/2009 | Kang |
| 2009/0250162 A1 | 10/2009 | Smythe et al. |
| 2010/0039850 A1 | 2/2010 | Kitazaki |
| 2010/0110753 A1 | 5/2010 | Slesazeck |
| 2010/0110758 A1 | 5/2010 | Li et al. |
| 2010/0140589 A1 | 6/2010 | Ionescu |
| 2010/0207168 A1 | 8/2010 | Sills et al. |
| 2010/0232200 A1 | 9/2010 | Shepard |
| 2010/0270529 A1 | 10/2010 | Lung |
| 2010/0321975 A1 | 12/2010 | Kimura et al. |
| 2011/0012085 A1 | 1/2011 | Deligianni et al. |
| 2011/0033955 A1 | 2/2011 | Kang |
| 2011/0037046 A1 | 2/2011 | Sato et al. |
| 2011/0147888 A1 | 6/2011 | Steigerwald et al. |
| 2011/0210326 A1 | 9/2011 | Suzawa et al. |
| 2011/0248324 A1 | 10/2011 | Kang |
| 2011/0261607 A1 | 10/2011 | Tang |
| 2011/0292713 A1 | 12/2011 | Perner |
| 2012/0001144 A1 | 1/2012 | Greeley et al. |
| 2012/0007167 A1 | 1/2012 | Hung et al. |
| 2012/0052640 A1 | 3/2012 | Fischer et al. |
| 2012/0140542 A1 | 6/2012 | Liu |
| 2012/0164798 A1 | 6/2012 | Sills et al. |
| 2012/0187363 A1 | 7/2012 | Liu |
| 2012/0211722 A1 | 8/2012 | Kellam et al. |
| 2012/0243306 A1 | 9/2012 | Karpov et al. |
| 2012/0248398 A1 | 10/2012 | Liu |
| 2012/0256246 A1 | 10/2012 | Izumi |
| 2012/0280291 A1 | 11/2012 | Lee et al. |
| 2012/0292584 A1 | 11/2012 | Rocklein et al. |
| 2012/0292686 A1 | 11/2012 | Son et al. |
| 2012/0319185 A1 | 12/2012 | Liang et al. |
| 2012/0327714 A1 | 12/2012 | Lue |
| 2013/0009125 A1 | 1/2013 | Park et al. |
| 2013/0020575 A1 | 1/2013 | Ishizuka et al. |
| 2013/0043455 A1 | 2/2013 | Bateman |
| 2013/0056698 A1 | 3/2013 | Satoh et al. |
| 2013/0056699 A1 | 3/2013 | Lung |
| 2013/0092894 A1 | 4/2013 | Sills et al. |
| 2013/0099303 A1 | 4/2013 | Huang et al. |
| 2013/0126816 A1 | 5/2013 | Tang et al. |
| 2013/0153984 A1 | 6/2013 | Ramaswamy |
| 2013/0193400 A1 | 8/2013 | Sandhu et al. |
| 2013/0214242 A1 | 8/2013 | Sandhu |
| 2014/0034896 A1 | 2/2014 | Ramaswamy et al. |
| 2014/0077150 A1 | 3/2014 | Ho et al. |
| 2014/0097484 A1 | 4/2014 | Seol et al. |
| 2014/0106523 A1 | 4/2014 | Koldiaev |
| 2014/0138753 A1 | 5/2014 | Ramaswamy et al. |
| 2014/0153312 A1 | 6/2014 | Sandhu et al. |
| 2014/0252298 A1 | 9/2014 | Li et al. |
| 2014/0269002 A1 | 9/2014 | Jo |
| 2014/0269046 A1 | 9/2014 | Laurin et al. |
| 2014/0353568 A1 | 12/2014 | Boniardi et al. |
| 2015/0029775 A1 | 1/2015 | Ravasio et al. |
| 2015/0041873 A1 | 2/2015 | Karda et al. |
| 2015/0054063 A1 | 2/2015 | Karda et al. |
| 2015/0097154 A1 | 4/2015 | Kim et al. |
| 2015/0102280 A1 | 4/2015 | Lee |
| 2015/0123066 A1 | 5/2015 | Gealy et al. |
| 2015/0129824 A1 | 5/2015 | Lee et al. |
| 2015/0200202 A1 | 7/2015 | Karda et al. |
| 2015/0243708 A1 | 8/2015 | Ravasio et al. |
| 2015/0248931 A1 | 9/2015 | Nazarian |
| 2015/0311349 A1 | 10/2015 | Ramaswamy |
| 2015/0340610 A1 | 11/2015 | Jung et al. |
| 2015/0364565 A1 | 12/2015 | Ramaswamy et al. |
| 2015/0380641 A1 | 12/2015 | Ino et al. |
| 2016/0005961 A1 | 1/2016 | Ino |
| 2016/0043143 A1 | 2/2016 | Sakotsubo |
| 2016/0104748 A1 | 4/2016 | Ravasio et al. |
| 2016/0240545 A1 * | 8/2016 | Karda ............... H01L 27/11507 |

FOREIGN PATENT DOCUMENTS

| | | |
|---|---|---|
| EP | 1624479 | 2/2006 |
| JP | H09-232447 | 9/1997 |
| JP | H10-93083 | 10/1998 |
| JP | H11-274429 | 10/1999 |
| KR | 10-0799129 | 1/2008 |
| TW | 107100863 | 9/2018 |
| WO | WO 1999/014761 | 3/1999 |
| WO | WO 2008/073529 | 6/2008 |
| WO | PCT/US2017/068317 | 4/2018 |
| WO | WO PCT/US2017/068317 | 4/2018 |

OTHER PUBLICATIONS

Pontes, et al.; Synthesis, optical and ferroelectric properties of PZT thin films: experimental and theoretical investigation; J. Mater. Chem vol. 22; 2012; pp. 6587-6596.

(56) References Cited

OTHER PUBLICATIONS

Robertson, Band offsets of wide-band-gap oxides and implications for future electronic devices; J. Vac. Sci. Technol., B 18(3): May 2000, pp. 1785-1791.

Rotaru et al.; Amorphous Phase Influence on the Optical Bandgap of Polysilicon; phys. stat. sol. (a) 171; 1999; pp. 365-370.

Arimoto et al., "Current Status of Ferroelectric Random-Acess Memory", MRS Bulletin, Nov. 2004, United Kingdom, pp. 823-828.

Das et al., "High Performance Multliayer MoS2 Transistors with Scandium Contacts", NANO Letters, ACS Publications, Dec. 14, 2012, United States, pp. 100-105.

Kim et al., "A Functional Hybrid Memristor Crossbar-Array/CMOS System for Data Storage and Neuromorphic Applications", Nano Letters, Dec. 5, 2011, United States, pp. 389-395.

Lee et al., "Ferroelectric Nonvolatile Nanowire Memory Circuit Using a Single ZnO Nanowire and Copolymer Top Layer", Advanced Materials vol. 24, 2012, United States, pp. 3020-3025.

Lee et al., "Internal Resistor of Multi-Functional Tunnel Barrier for Selectivity and Switching Uniformity in Resistive Random Access Memory", Nanoscale Research Letters, 2014, Germany, 7 pages.

Lee et al., "MoS2 Nanosheets for Top-Gate Nonvolatile Memory Transistor Channel", Small vol. 8, No. 20, 2012, Germany, pp. 3111-3115.

Lembke et al., "Breakdown of High-Performance Monolayer MoS2 Transistors", ACS Nano (www.acsnano.org), Oct. 2, 2012, United States, pp. A-F.

Liu et al., "Growth of Large-Area and Highly Crystalline MoS2 Thin Layers on Insulating Substrates", NANO Letters, ACS Publications, Feb. 27, 2012, United States, pp. 1538-1544.

Liu et al., "Role of Metal Contacts in Designing High-Performance Monolayer n-Type WSe2 Field Effect Transistors", NANO Letters, ACS Publications, Mar. 25, 2013, United States, pp. 1983-1990.

Lous, "Ferroelectric Memory Devices: How to Store the Information of the Future?", Top Master Programme in Nanoscience, Jul. 2011, Netherlands, 23 pages.

Min et al., "Nanosheet Thickness-Modulated MoS2 Dielectric Property Evidenced by Field-Effect Transistor Performance", Nanoscale, The Royal Society of Chemistry, Dec. 3, 2012, United Kingdom, 2 pages.

Radisavljevic et al., "Single-Layer MoS2 Transistors", Nature Nanotechnology vol. 6, Mar. 2011, United Kingdom, pp. 147-150.

Sakai et al., "Recent Progress of Ferroelectric-Gate Field-Effect Transistors and Applications to Nonvolatile Logic and FeNAND Flash Memory", Materials vol. 3, Nov. 2010, Switzerland, pp. 4950-4964.

Tokumitsu et al., "Nonvolatile Ferroelectric-gate Field-Effect Transistors using SrBi2Ta2O9/Pt/SrTa2O6/SiON/Si Structures", Applied Physics Letters vol. 75, No. 4, Jul. 26, 1999, United States, pp. 575-577.

Wikipedia, "Ferroelectric RAM", available online at http://en.wikipedia.org/wiki/Ferroelectric_RAM, Feb. 25, 2013, 6 pages.

Zhan et al., "Large Area Vapor Phase Growth and Characterization of MoS2 Atomic Layers on SiO2 Substrate", Department of Mechanical Engineering & Materials Science, Rice University, Feb. 15, 2012, United States, 24 pages.

Zhang et al., "Ambipolar MoS2 Thin Flake Transistors", NANO Letters, ACS Publications, Jan. 25, 2012, United States, pp. 1136-1140.

* cited by examiner

US 10,396,145 B2

MEMORY CELLS COMPRISING FERROELECTRIC MATERIAL AND INCLUDING CURRENT LEAKAGE PATHS HAVING DIFFERENT TOTAL RESISTANCES

TECHNICAL FIELD

Embodiments disclosed herein pertain to memory cells and to methods of forming a capacitor.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, select lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. One type of capacitor is a ferroelectric capacitor which has ferroelectric material as at least part of the insulating material. Ferroelectric materials are characterized by having two stable polarized states. Polarization state of the ferroelectric material can be changed by application of suitable programming voltages, and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor.

One type of memory cell has a select device electrically coupled in series with a ferroelectric capacitor. Current typically leaks through the select device to adjacent substrate material even when the select device is idle (i.e., when inactive or "off"). This leads to voltage drop at the adjacent electrode of the ferroelectric capacitor, thus creating a voltage differential between the two capacitor electrodes. This results in an electric field being applied across the ferroelectric material when the memory cell is idle. Even if small, such an electric field may start to flip individual dipoles in the ferroelectric material and continue until all are flipped, thus erasing a programmed state of the memory cell. This can occur over a small amount of time, thereby destroying or preventing non-volatility in the memory cell.

DETAILED DESCRIPTION OF EXAMPLE EMBODIMENTS

Figure 1:
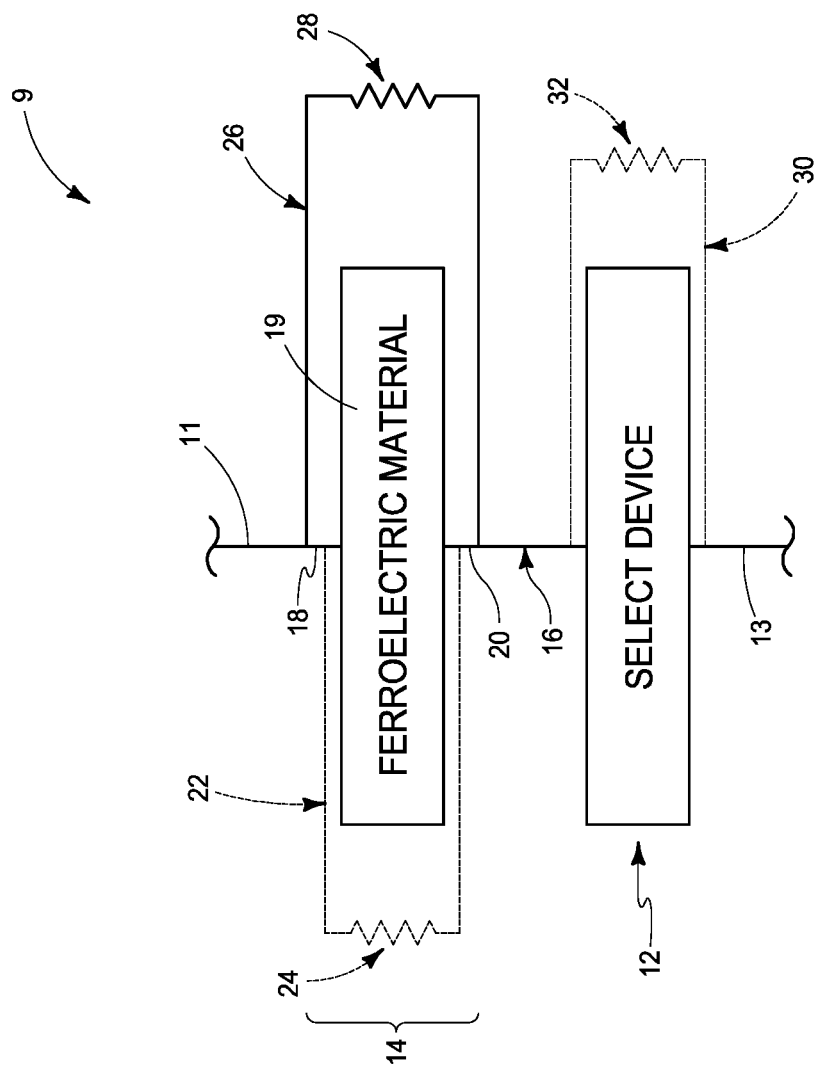
FIG. 1 is a schematic-like diagrammatic view of a memory cell in accordance with an embodiment of the invention.

A memory cell 9 in accordance with an embodiment of the invention is shown and initially described with reference to a schematic-like FIG. 1. Integrated circuitry (not shown) having memory cell 9 would likely have thousands or millions of such memory cells fabricated relative to a memory array or sub-array, and are not particularly material to the disclosure herein. Such arrays or sub-arrays would likely have a plurality of access lines and digit lines having individual memory cells 9 there-between where such cross. Individual memory cells may be considered as comprising the portions of an individual access line and a crossing individual digit line.

Memory cell 9 comprises a select device 12 and a capacitor 14 electrically coupled in series (i.e., circuit) with select device 12, for example by a conductive (i.e., electrically) path 16 as shown. Capacitor 14 in the depicted diagram may be considered as comprising two conductive capacitor electrodes 18 and 20 having ferroelectric material 19 there-between. Physically, path 16 may simply be a single electrode shared by capacitor 14 and select device 12. Capacitor 14 comprises an intrinsic current (i.e., electrical) leakage path from one of capacitor electrodes 18 or 20 to the other through ferroelectric material 19. Such intrinsic path is diagrammatically shown as a dashed line in a path 22 going around ferroelectric material 19 for clarity in FIG. 1. However in reality, path 22 would intrinsically/inherently be through ferroelectric material 19 to and between each of capacitor electrodes 18 and 20. Intrinsic path 22 will have some comparatively rather high overall/total resistance (i.e., electrical) which is diagrammatically indicated as a resistor 24 as device 14 in operation functions as a capacitor. Total resistance of resistor 24 will depend upon composition of ferroelectric material 19, thickness of ferroelectric material 19, and dipole orientation within ferroelectric material 19. Resistor 24 may inherently be a non-linear/variable resistor whereby its resistance is voltage dependent.

Memory cell 9 comprises a parallel (i.e., circuit-parallel) current leakage path 26 from one capacitor electrode 18 or 20 to the other. In one embodiment, parallel path 26 has a dominant band gap of 0.4 eV to 5.0 eV, and in one embodiment that is less than that of ferroelectric material 19. Such may be greater than dominant band gap of ferroelectric material 19 if parallel path 26 is sufficiently shorter in length than path 22. Regardless, in one embodiment parallel path 26 has some total resistance (e.g., shown as a resistor 28) that is lower than the total resistance of intrinsic path 22. By way of examples only, total resistance through intrinsic leakage path 22 may be $1 \times 10^{11}$-$1 \times 10^{18}$ ohms and total resistance through parallel leakage path 26 may be $1 \times 10^{7}$-$1 \times 10^{17}$ ohms. In one embodiment, the parallel current leakage path is configured so that current there-through when the memory cell is idle is no more than one nanoampere.

Select device 12 may be any existing or yet-to-be-developed select device, including multiple devices. Examples include diodes, field effect transistors, and bipolar transistors. In operation, select device 12 will exhibit current leakage when the memory cell is idle (i.e., when the integrated circuitry associated with memory cell 9 is operationally "on", but no "read" or "write" operation of memory cell 9 is occurring). A select device current leakage path 30 exists, and is diagrammatically shown as a dashed line around select device 12, although such would be intrinsically/inherently through select device 12 or to underlying substrate (e.g, held at ground or other potential). Leakage path 30 is shown as having some total resistance 32. In one embodiment, parallel path 26 is configured so that current there-through when memory cell 9 is idle is greater than or equal to current leakage through path 30 when memory cell 9 is idle. Such will be dependent upon the construction and materials of select device 12, capacitor 14, parallel path 26, and upon voltages at various points within memory cell 9 in normal operation. Ideally and regardless, such enables voltage at electrodes 18 and 20 to be equal or at least very close to one another (e.g., within 50 millivolts) when idle whereby no or negligible electric field is created within ferroelectric material 19 when memory cell 9 is idle. For example and further, any voltage differential across the capacitor when idle ideally is such that any electric field in ferroelectric material 19 is at least 20 times lower than the intrinsic coercive field of ferroelectric material 19. Such may preclude unintended dipole direction change within ferroelectric material 19. Alternately as examples, such may at least reduce risk of or increase time until unintended dipole direction change within ferroelectric material 19.

In one embodiment, resistor 28 in parallel path 26 is a non-linear resistor between capacitor electrodes 18 and 20 exhibiting overall higher resistance at higher voltages (e.g., between 1 to 5 Volts) than at lower voltages (e.g., less than 250 millivolts). Ideally, such a non-linear resistor is formed towards providing a greater magnitude of reduction of current leakage in parallel path 26 during higher voltage "read" and "write" operations as compared to when idle at lower voltage.

An access line and a digit line (neither being shown) would likely be associated with memory cell 9. For example, select device 12 may be a simple two terminal diode or other two terminal device. A cross point-like array construction may then be used whereby a conductive path 11 as part of first capacitor electrode 18 connects with or is part of an access or digit line (not shown) and a conductive path 13 as part of select device 12 connects with or is part of the other of an access or digit line (not shown). As an alternate example, select device 12 may be a field effect transistor. Then, as an example, conductive path 11 may be part of a capacitor cell electrode 18 that is common to multiple capacitors 14 (not shown) within a memory array or sub-array, component 16 may be one source/drain region of the transistor, and component 13 may be the other. The gate (not shown) of the transistor may be a portion of an access line (not shown), and source/drain component 13 may connect with or be part of a sense line (not shown). Other architectures and constructions could alternately of course be used.

FIGS. 2-5 diagrammatically show an example physical construction of a portion of a memory cell 9 comprising capacitor 14 and parallel current leakage path 26 in accordance with an embodiment of the invention. Like numerals from the above-described embodiments have been used where appropriate, with some differences being indicated with different numerals. FIGS. 2-5 depict a portion of a fragment or construction 10 comprising a base substrate 50 that may include any one or more of conductive/conductor/conducting (i.e., electrically herein), semiconductive, or insulative/insulator/insulating (i.e., electrically herein) materials. Various materials are shown above base substrate 50. Materials may be aside, elevationally inward, or elevationally outward of the depicted FIGS. 2-5 materials. For example, other partially or wholly fabricated components of integrated circuitry may be provided somewhere above, about, or within substrate 50 (e.g., memory cell 9 including capacitor 14 being shown), and are not particularly germane to the inventions disclosed herein. Select device 12 may be electrically coupled to either one of capacitor electrodes 18 or 20, with such shown being schematically connected to electrode 18 through a conductor 56. Regardless, unless otherwise indicated, any of the materials, regions, and structures described herein may be homogenous or non-homogenous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

An insulative-comprising material 52 is shown as being above base substrate 50. By way of example only, such is shown as comprising material 53 above base substrate 50, material 54 above material 53, and material 55 above material 54. In this document, unless otherwise indicated, "elevational(ly)", "higher", "upper", "lower", "top", "atop", "bottom", "above", "below", "under", "beneath", "up", and "down" are generally with reference to the vertical direction. Further, "vertical" and "horizontal" as used herein are directions that are perpendicular or within 10 degrees of perpendicular relative one another independent of orientation of the substrate in three-dimensional space. "Horizontal" refers to a general direction (i.e., within 10 degrees) along a primary substrate surface and may be relative to which the substrate is processed during fabrication. Also, "extend(ing) elevationally" and "elevationally-extending" in this document encompasses a range from vertical to no more than 45° from vertical. An example material 53 is silicon nitride above silicon dioxide. An example material 54 is doped silicon dioxide, and an example material 55 is silicon nitride. Example thicknesses for materials 53, 54, and 55 are 250 to 500 Angstroms, 0.4 micron to 1.0 micron, and 250 to 500 Angstroms, respectively.

In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Figure 2:
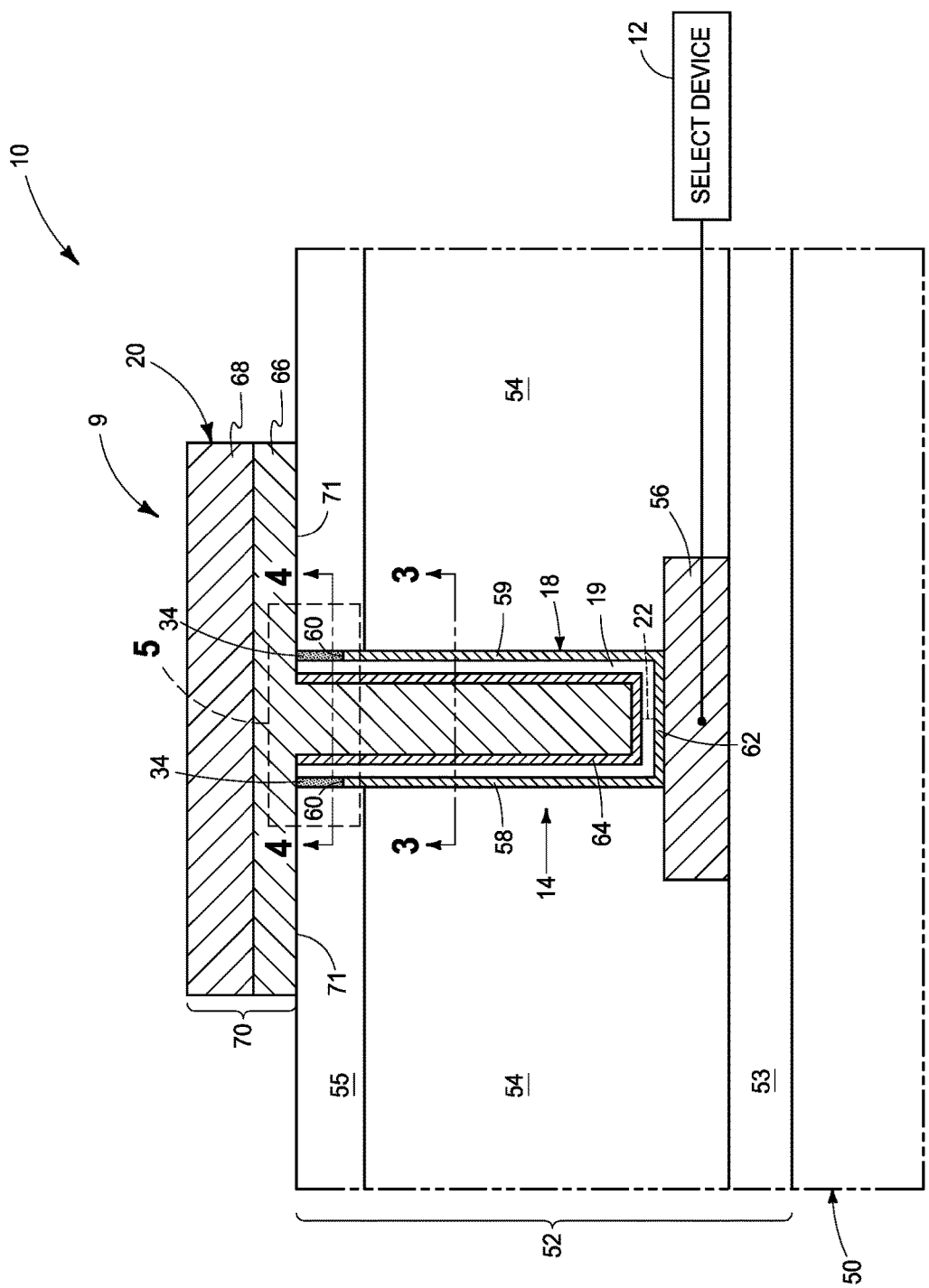
FIG. 2 is a diagrammatic sectional view of a memory cell in accordance with an embodiment of the invention.

Example construction 10 comprises lower conductor 56 which, for example, may be a conductive line running into and out of the plane of the page upon which FIG. 2 lies, for example an access line or a digit line, or be electrically coupled (in one embodiment, directly electrically coupled) to or part of a select device 12. In this document, regions/materials/components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions/materials/components. In contrast, when regions/materials/components are referred to as being "directly electrically coupled", no intervening electronic component (e.g., no diode, transistor, resistor, transducer, switch, fuse, etc.) is between the directly electrically coupled regions/materials/components. Example conductive materials for conductor 56, and for any conductive material herein, include one or more of elemental metal, a mixture or alloy of two or more elemental metals, conductive metal compounds, and conductively doped semiconductive materials, with TiN being one specific example for conductor 56.

Capacitor 14 comprises a first conductive capacitor electrode 18 that in one embodiment has laterally-spaced walls 58, 59 that individually have a top surface 60. In one embodiment, first capacitor electrode 18 has a bottom 62 extending laterally to and between laterally-spaced walls 58, 59. Alternately and by way of example only, first capacitor electrode 18 may comprise an upwardly and downwardly-open (not shown) conductive material cylinder (e.g., little or no bottom 62 extending between walls 58, 59). Capacitor 14 includes a second conductive capacitor electrode 20 which in the depicted embodiment is laterally between walls 58, 59 of first capacitor electrode 18. Second capacitor electrode 20 is shown as comprising a conductive material 64 (e.g., TiN), a conductive material 66 (e.g., W), and a conductive material 68 (e.g., TiN). For purposes of the continuing discussion, second capacitor electrode 20 may be considered as comprising a portion 70 that is above first capacitor electrode 18. Portion 70 comprises an elevationally-inner surface 71 that is above first capacitor electrode 18, and in one embodiment of which is an elevationally-innermost surface of portion 70 that is above first capacitor electrode 18. Example thicknesses for constructions/materials 18, 64, 66, 68, and 70 are 30 to 50 Angstroms, 30 to 50 Angstroms, 200 to 400 Angstroms, 300 to 500 Angstroms, and 500 to 900 Angstroms.

Ferroelectric material 19 is laterally between walls 58, 59 of first capacitor electrode 18 and laterally-between second capacitor electrode 20 and first capacitor electrode 18. Example ferroelectric materials include ferroelectrics that have one or more of transition metal oxide, zirconium, zirconium oxide, niobium, niobium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare-earth element. An example thickness for ferroelectric material 19 is 15 to 200 Angstroms. As asserted above with respect to FIG. 1, capacitor 14 in FIGS. 2-5 comprises an intrinsic current leakage path 22 from one of the first and second capacitor electrodes to the other through the ferroelectric material.

Parallel path 26 is shown as being encompassed by or within a material 34. Parallel path 26 is shown as extending between a) elevationally inner surface 71 of portion 70 of second capacitor electrode 20 that is above first capacitor electrode 18, and b) at least one of individual top surfaces 60 (in one embodiment and as shown both top surfaces 60) of laterally-spaced walls 58, 59 of first capacitor electrode 18. As shown, parallel current leakage path 26 is circuit-parallel intrinsic current leakage path 22, and is of lower total resistance than the intrinsic current leakage path. Example materials 34 includes one or more of amorphous silicon, polycrystalline silicon, germanium, chalcogenide (e.g., metal dichalcogenides), silicon-rich silicon nitride, silicon-rich silicon oxide, and intrinsically dielectric material suitably doped with conductivity increasing dopants (e.g., $SiO_2$ and/or $Si_3N_4$ doped with one or more of Ti, Ta, Nb, Mo, Sr, Y, Cr, Hf, Zr, W, and lanthanide series ions). Material 34, and thereby parallel path 26, may predominantly (i.e., more than 50 atomic %) comprise such material(s). Any of these materials may be doped or undoped to provide desired total resistance for current leakage flow there-through when memory cell 9 is idle.

In one embodiment, material 34 is homogenous whereby parallel path 26 between capacitor electrodes 18 and 20 is homogenous. In one embodiment, material 34 is non-homogenous whereby parallel path 26 between capacitor electrodes 18 and 20 is non-homogenous. In an embodiment where material 34 and thereby parallel path 26 are non-homogenous, parallel path 26 may have multiple band gaps due to different composition materials therein having different band gaps. Yet, parallel path 26 may have a dominant (meaning controlling) band gap of 0.4 eV to 5.0 eV likely dependent on the respective volumes of the individual different materials within parallel path 26. Accordingly, and regardless, "dominant" is used and applies herein regardless of homogeneity of the particular path/material. In one embodiment, dominant band gap of ferroelectric material 19 may be lower than that of parallel path 26. In one embodiment, minimum length of parallel path 26 is made longer than minimum thickness of ferroelectric material 19. As one example, such a length relationship may be used when density of states in the parallel path is equal to or greater than that in the ferroelectric material when dominant band gaps of the ferroelectric material and parallel path are about the same. As another example, such a length relationship may be used when density of states in the parallel path is equal to or greater than that in the ferroelectric material when dominant band gap of the ferroelectric material is less than that of the parallel path.

Figure 4:
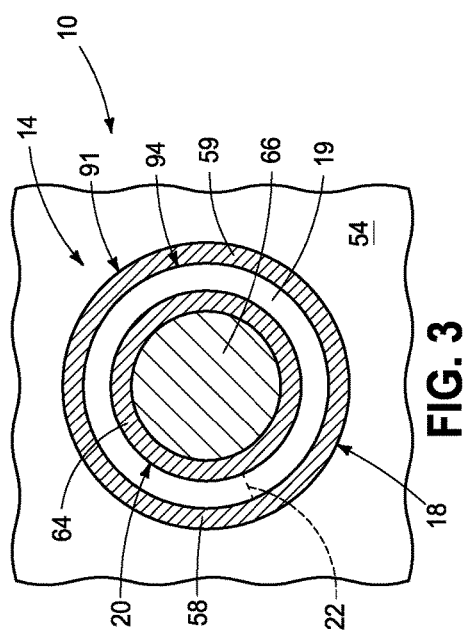
FIG. 4 is an enlarged cross-sectional view taken through line 4-4 in FIG. 2.
Figure 5:
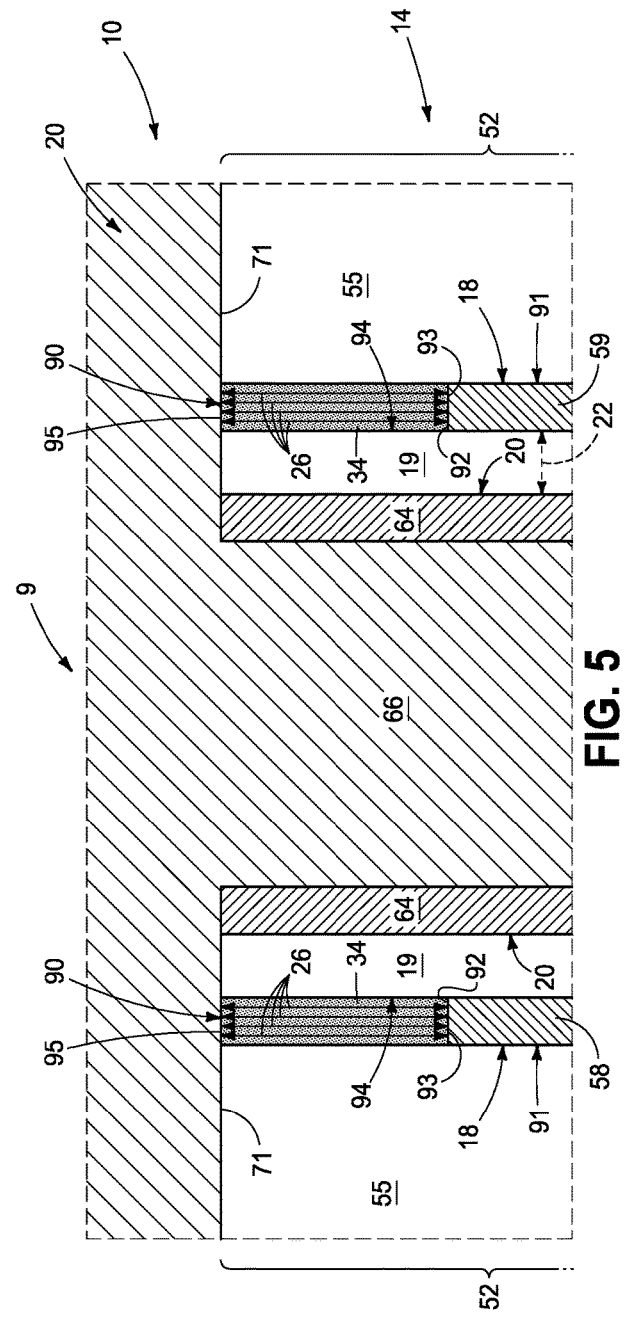
FIG. 5 is an enlarged cross-sectional view taken within box 5 in FIG. 2.
Figure 6:
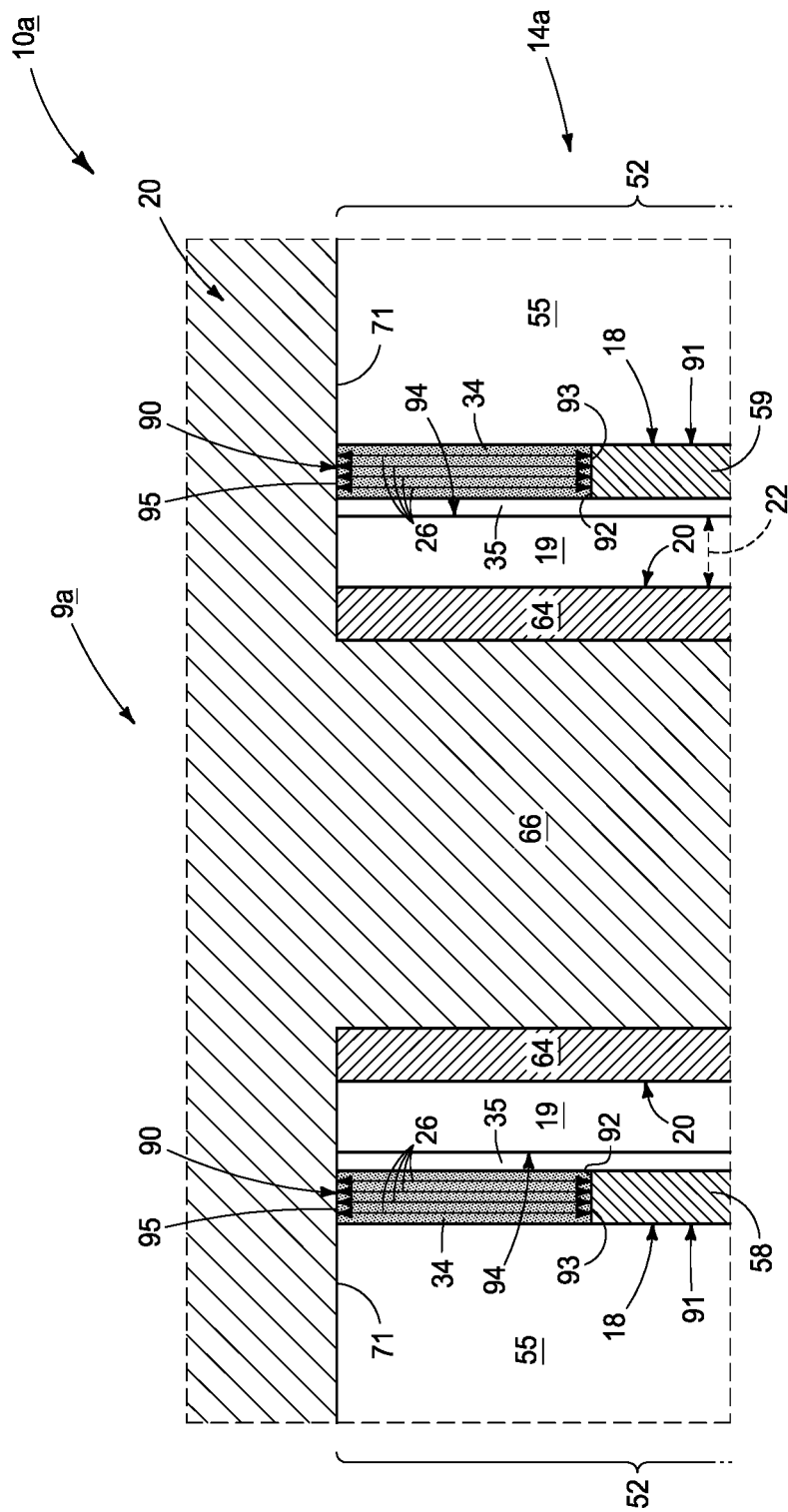
FIG. 6 is a diagrammatic cross-sectional view of a memory cell in accordance with an embodiment of the invention.

In one embodiment and as shown in FIGS. 2-5, material 34 and thereby parallel path 26 are directly against ferroelectric material 19. FIG. 6 depicts an alternate embodiment memory cell 9a wherein parallel path 26 is not directly against ferroelectric material 19. Like numerals from the above-described embodiments have been used where appropriate, with some construction differences being indicated with the suffix "a" or with different numerals. Capacitor 14a is shown as comprising some material 35 (e.g., dielectric material such as silicon dioxide and/or silicon nitride) spaced between materials 34 and 19 whereby parallel path 26 is not directly against ferroelectric material 19. Any other attribute(s) or aspect(s) as described herein and/or shown may be used.

In one embodiment, memory cell 9 comprises a select device, for example a select device 12 schematically shown as electrically coupling (in one embodiment directly electrically coupling) with first capacitor electrode 18 through conductor 56 in FIG. 2. In one such embodiment, in operation, the select device exhibits currents leakage when the memory cell is idle, with the parallel path being configured so that current there-through when the memory cell is idle is greater than or equal to said current leakage of the select device when the memory cell is idle.

Figure 3:
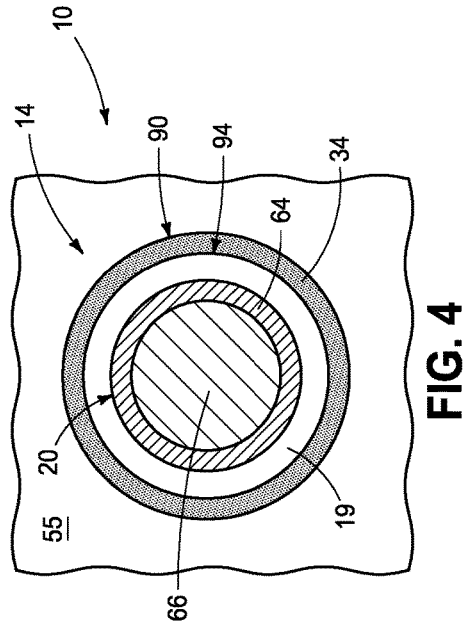
FIG. 3 is an enlarged cross-sectional view taken through line 3-3 in FIG. 2.

In one embodiment, a memory cell comprises a capacitor comprising a first conductive capacitor electrode (e.g., 18, and regardless of whether having laterally-spaced walls). The capacitor comprises a second conductive capacitor electrode (e.g., 20) comprising a portion (e.g., 70) above first capacitor electrode 18. Ferroelectric material (e.g., 19) is between second capacitor electrode 20 and first capacitor electrode 18. The capacitor comprises an intrinsic current leakage path (e.g., 22) from one of the first and second capacitor electrodes to the other through the ferroelectric material. A parallel current leakage path (e.g., 26) is between the second capacitor electrode and the first capacitor electrode. The parallel current leakage path is circuit-parallel the intrinsic path, is of lower total resistance than the intrinsic current leakage path, and comprises an annulus 90 (FIGS. 4-6). In one embodiment, the first capacitor electrode 18 comprises an annulus 91 (FIGS. 3, 5, 6). In one such embodiment, the annulus of the first capacitor electrode is directly against material (e.g., 34) of the parallel current leakage path that is in the shape of the annulus of the parallel current leakage path. In such one embodiment, a longitudinal end 92 of annulus 91 of first capacitor electrode 18 and a longitudinal end 93 of annulus 90 of the material of the parallel current leakage path are directly against one another (FIGS. 5 and 6). In one embodiment, the ferroelectric material comprises an annulus 94 (FIGS. 3-6) laterally inside the first electrode. Any other attribute(s) or aspect(s) as described herein and/or shown may be used.

In one embodiment, a memory cell comprises a capacitor comprising a first conductive capacitor electrode (e.g., 18, and independent of whether having laterally-spaced walls). The capacitor comprises a second conductive capacitor electrode (e.g., 20, and independent of whether comprising a portion above the first capacitor electrode). Ferroelectric material (e.g., 19) is between the second capacitor electrode and the first capacitor electrode. The capacitor comprises an intrinsic current leakage path (e.g., 22) from one of the first and second capacitor electrodes to the other through the ferroelectric material. A circuit-parallel current leakage path (e.g., 26) is between the second capacitor electrode and the first capacitor electrode. The circuit-parallel current leakage path is circuit-parallel the intrinsic current leakage path and of lower total resistance than the intrinsic current leakage path. The circuit-parallel current leakage path is physically-parallel and alongside the ferroelectric material from a bottom surface 93 to a top surface 95 (FIGS. 5 and 6) of material (e.g., 34) of the current leakage path. In one embodiment, the circuit-parallel current leakage path is directly against the ferroelectric material. In one such embodiment, the circuit-parallel current leakage path is directly against the ferroelectric material from the bottom surface to the top surface of the material of the current leakage path. Any other attribute(s) or aspect(s) as described herein and/or shown may be used.

Embodiments of the invention encompass methods of forming a capacitor and as well memory cells as identified above independent of method of manufacture. Example such embodiments are described with reference to FIGS. 7-16. Like numerals from above-described embodiments have been used for predecessor materials/constructions that result in a finished construction as shown, for example, in FIGS. 2-5.

Figure 7:
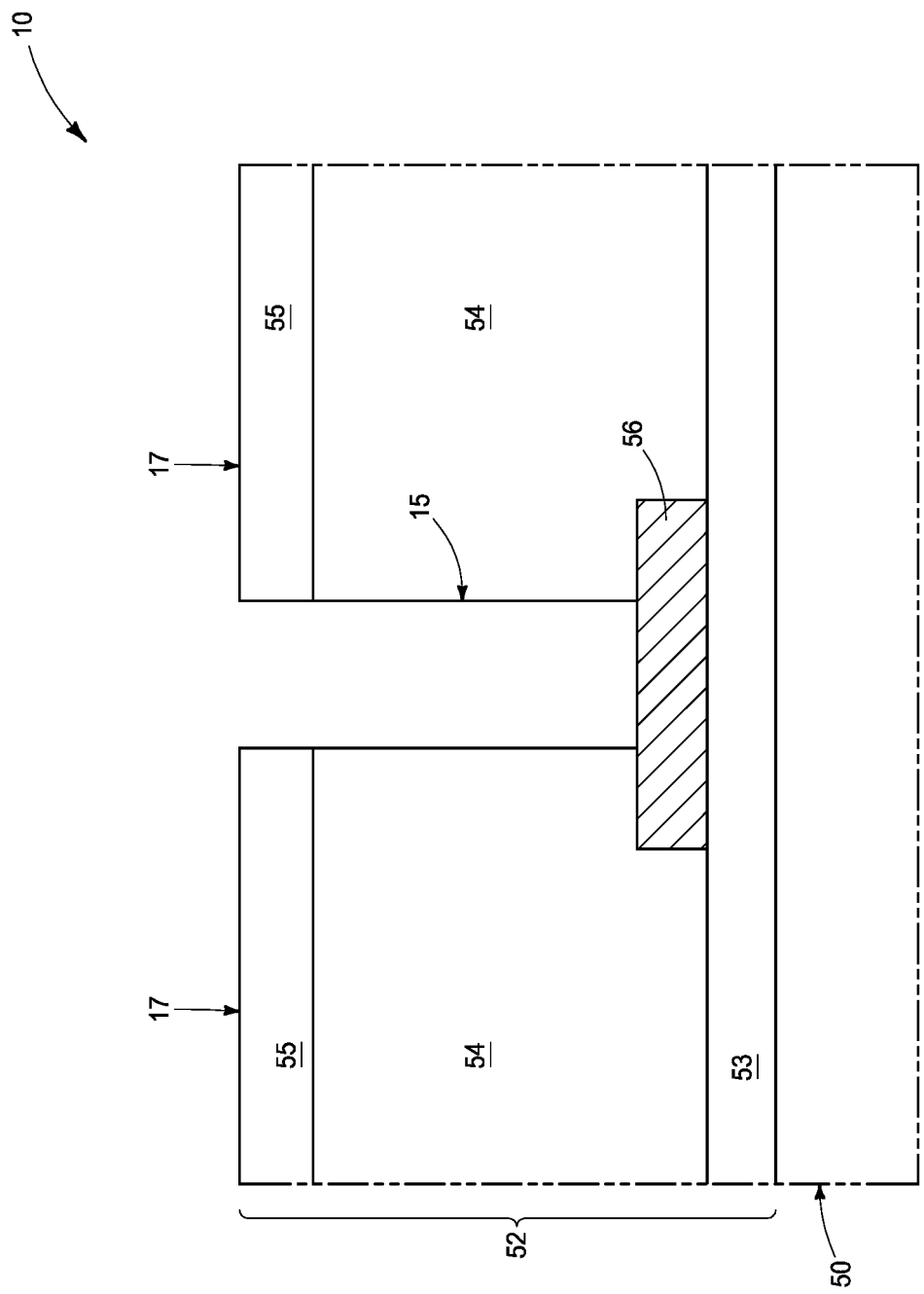
FIG. 7 is a diagrammatic cross-sectional view of a substrate construction in process in accordance with an embodiment of the invention.

Referring to FIG. 7, a capacitor opening 15 has been formed in insulative-comprising material 52. Capacitor opening 15 may be of any one or more shapes in horizontal cross section, for example circular, ellipsoidal, 4-sided (e.g., square or rectangular), 6-sided, a combination of straight and curved sides, etc. Capacitor opening 15 is shown as having straight vertical sidewalls, although such may be non-vertical and/or not straight. An example maximum open dimension for capacitor opening 15 is 300 to 600 Angstroms. Likely several capacitor openings 15 would be formed for forming several capacitors simultaneously. An example technique for forming capacitor opening 15 includes photolithographic patterning and etch with or without pitch multiplication.

Figure 8:
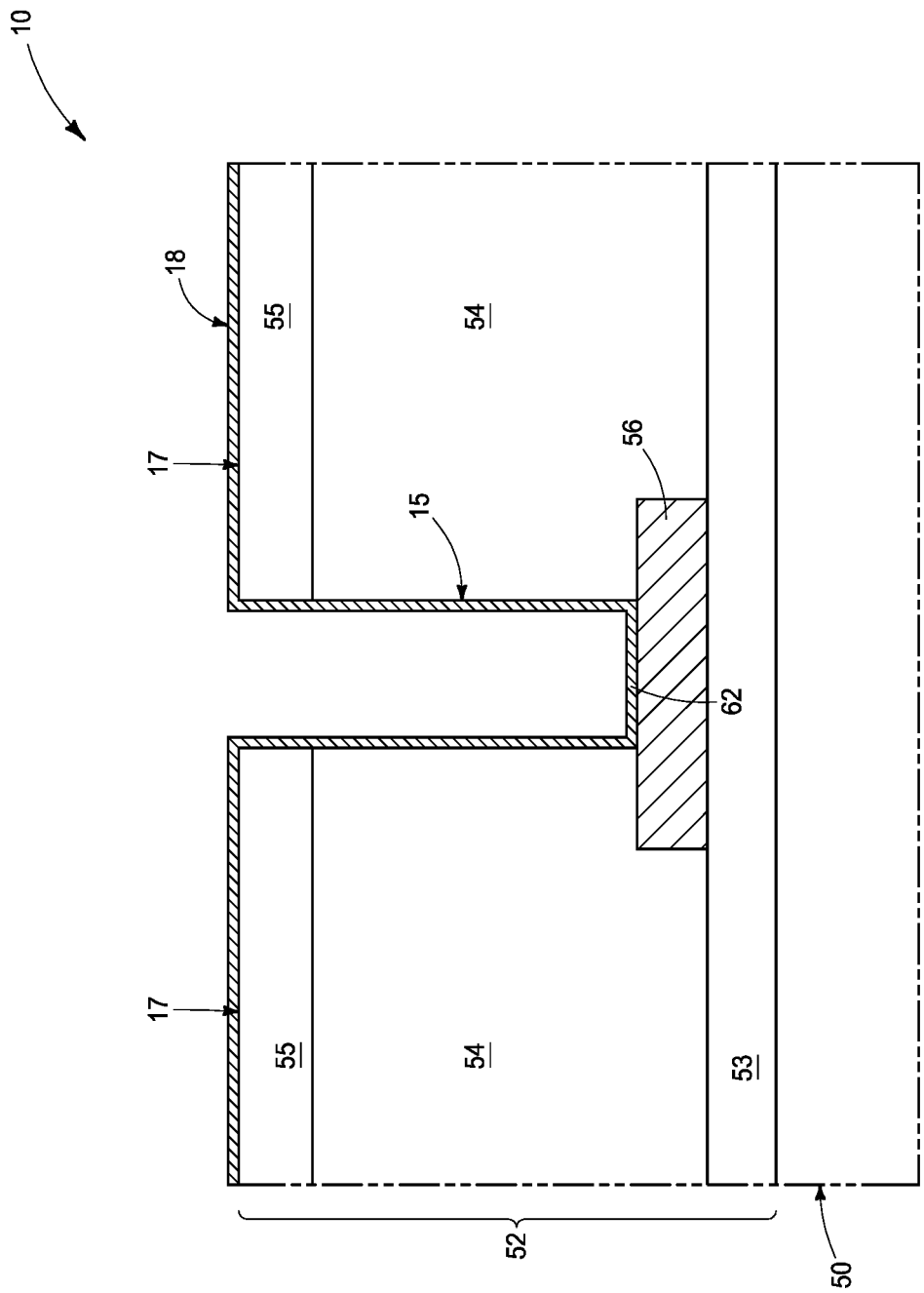
FIG. 8 is a view of the FIG. 7 construction at a processing step subsequent to that shown by FIG. 7.

Referring to FIG. 8, a conductive lining 18 has been formed in capacitor opening 15 to comprise a first conductive capacitor electrode of a capacitor being formed in capacitor opening 15. In one embodiment and as shown, material of conductive lining 18 extends outwardly of capacitor opening 15 and over an uppermost surface 17 of insulative-comprising material 52.

Figure 9:
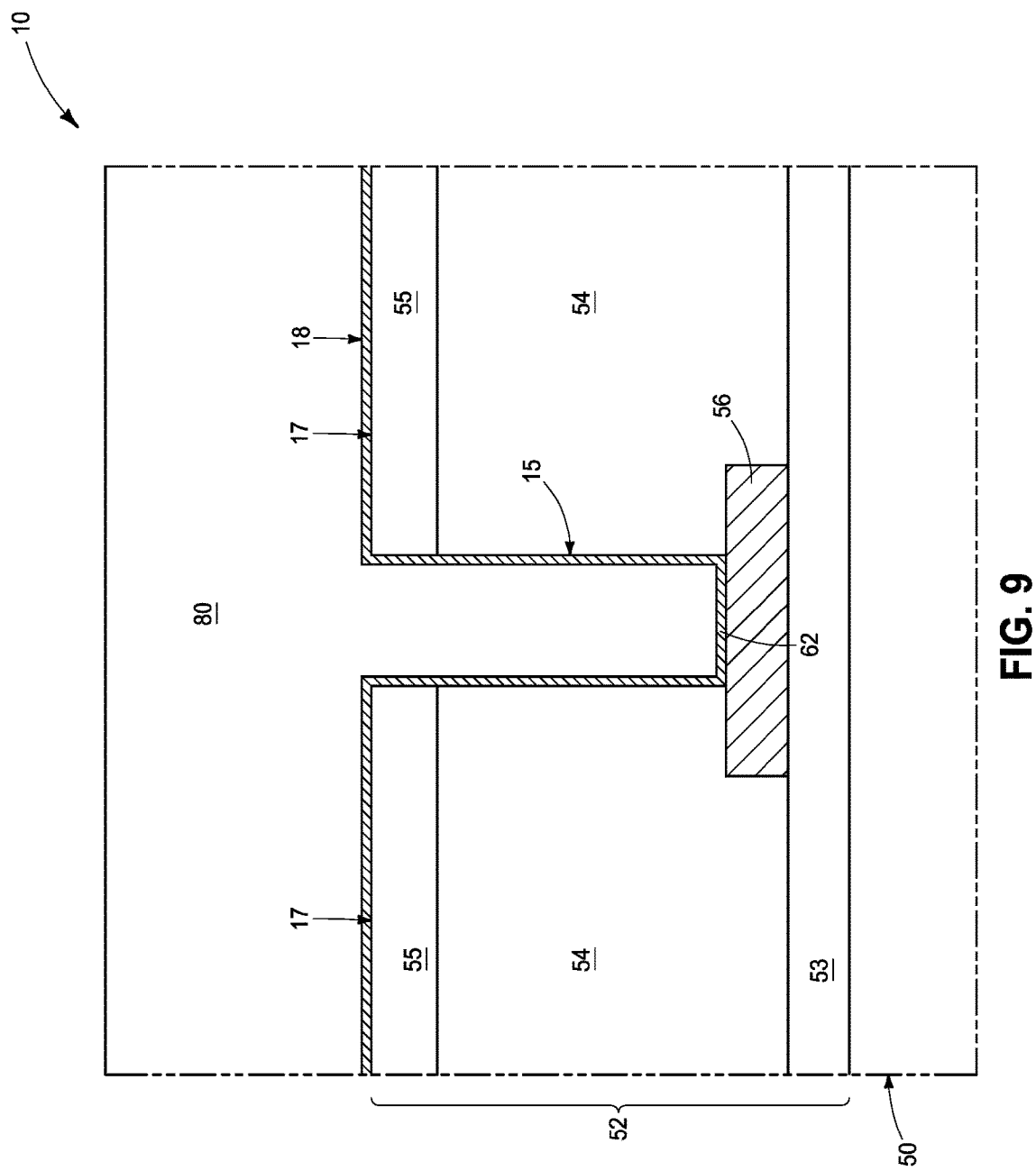
FIG. 9 is a view of the FIG. 8 construction at a processing step subsequent to that shown by FIG. 8.

Referring to FIG. 9, and in one embodiment, capacitor opening 15 with conductive lining 18 therein has been plugged with photoresist 80.

Figure 10:
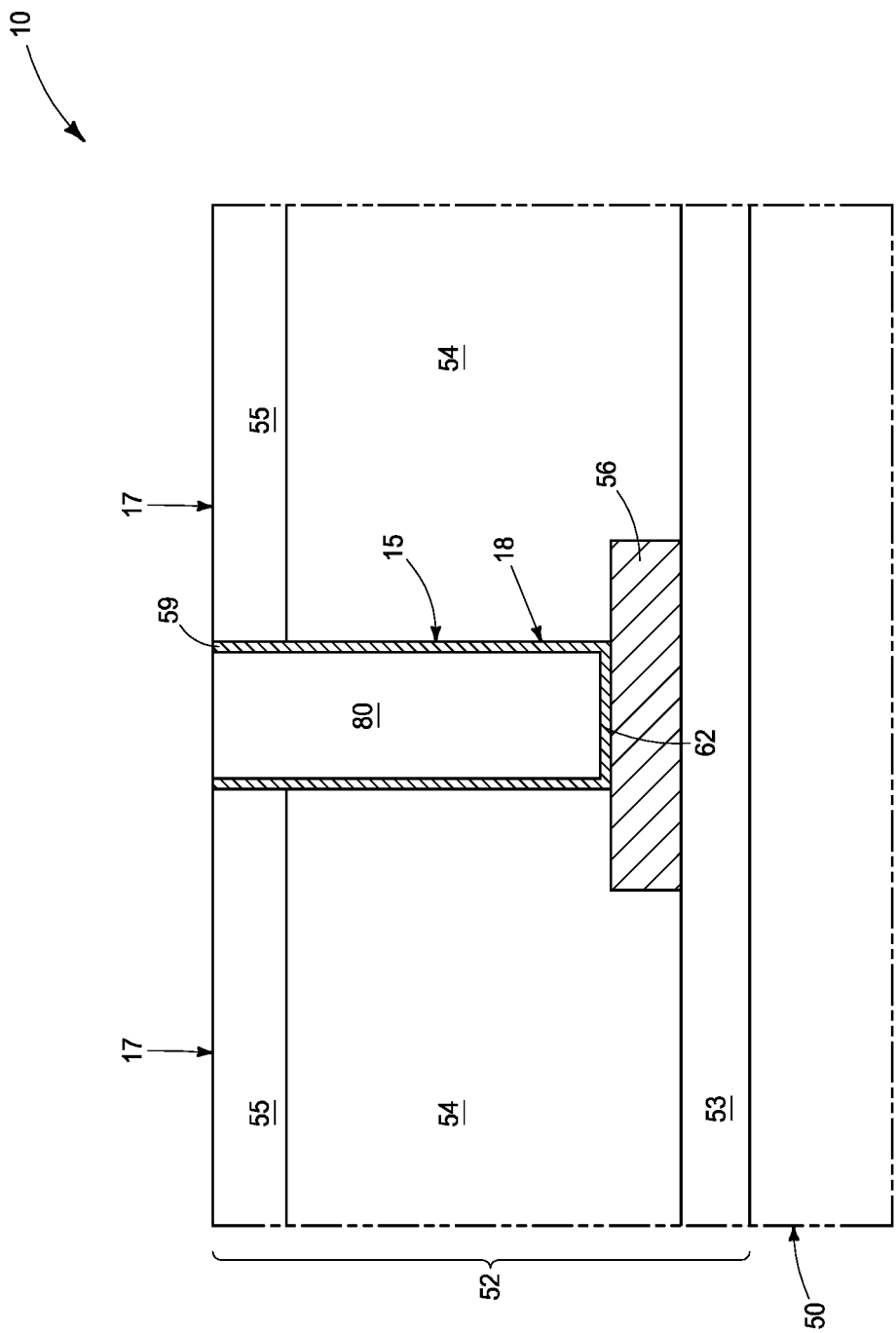
FIG. 10 is a view of the FIG. 9 construction at a processing step subsequent to that shown by FIG. 9.

Referring to FIG. 10, photoresist 80 and material of conductive lining 18 that extend outwardly of capacitor opening 15 over uppermost surface 17 have been removed back at least to uppermost surface 17.

Figure 11:
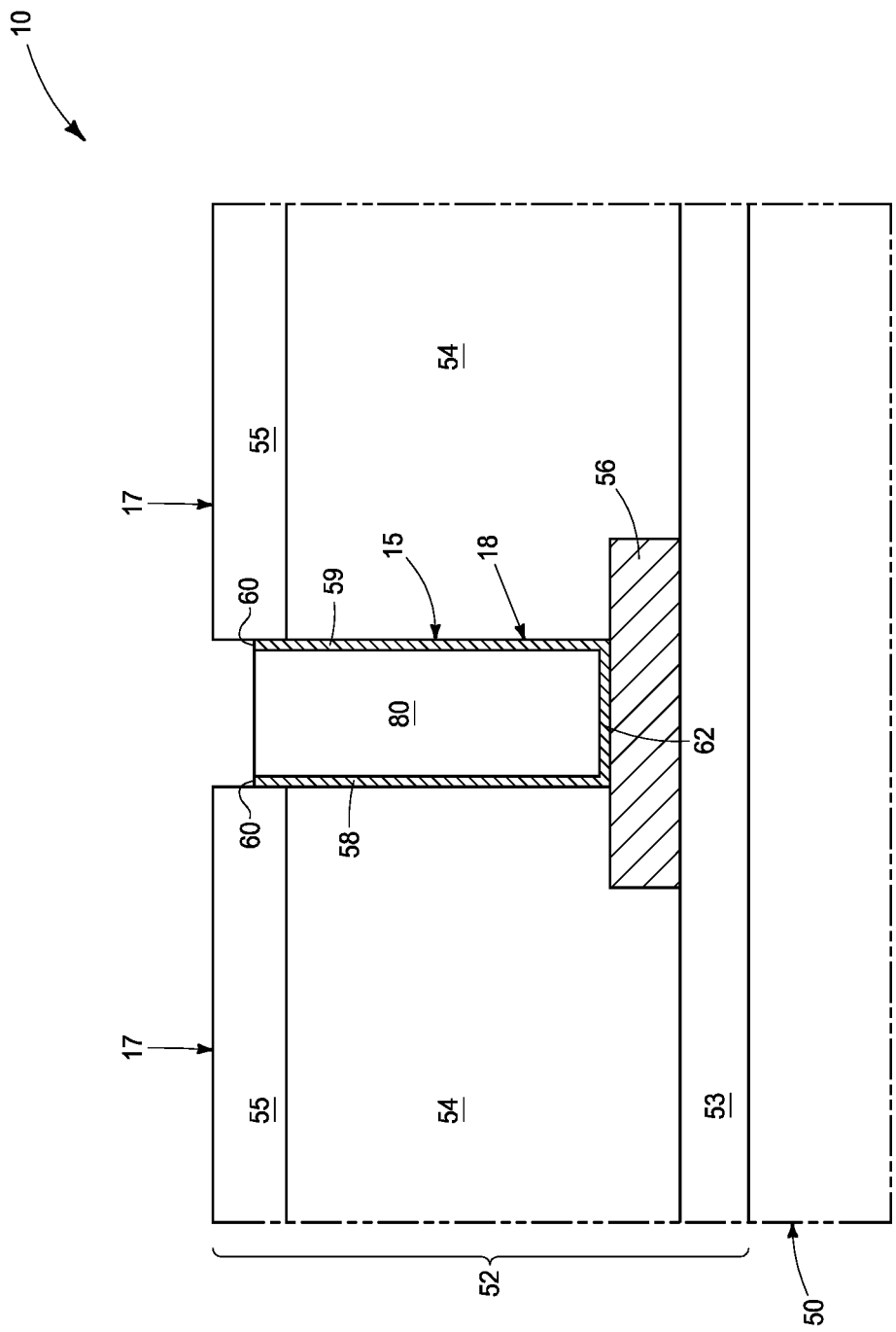
FIG. 11 is a view of the FIG. 10 construction at a processing step subsequent to that shown by FIG. 10.
Figure 12:
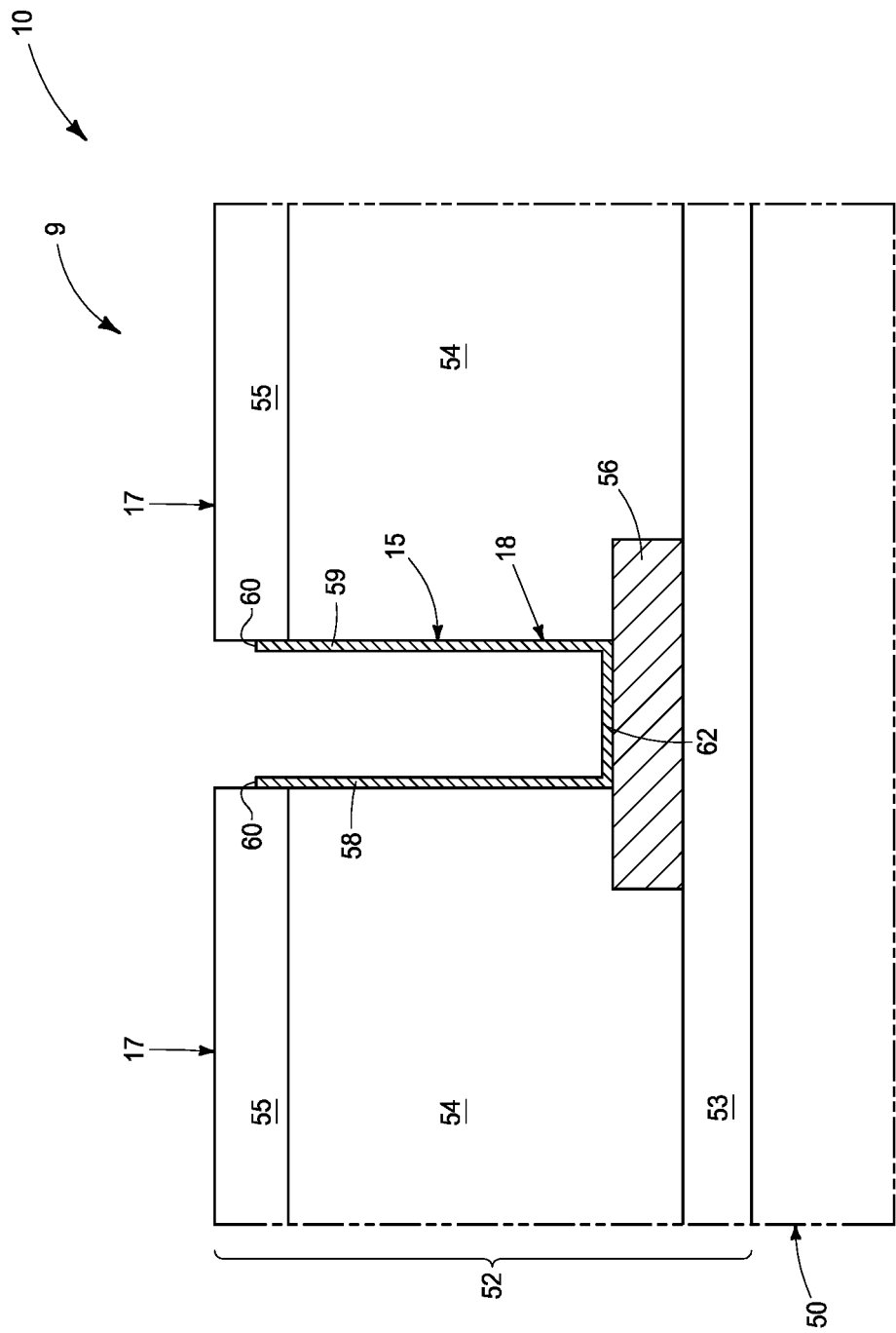
FIG. 12 is a view of the FIG. 11 construction at a processing step subsequent to that shown by FIG. 11.

Referring to FIG. 11, conductive lining 18 has been elevationally recessed in capacitor opening 15 relative to uppermost surface 17 of insulative-comprising material 52 thus, for example, completing fabrication of example first capacitor electrode 18. In one embodiment, first capacitor electrode 18 has laterally-opposing walls 58 and 59, and in one embodiment a bottom 62 extending laterally to and between laterally-spaced walls 58 and 59. Such acts of removing can be conducted by any suitable isotropic and/or anisotropic etching chemistry that etches material of lining/first capacitor electrode 18 selectively relative to material 55. In this document, a selective etch or removal is an etch or removal where one material is removed relative to another stated material at a rate of at least 2.0:1. Photoresist 80 is shown remaining within capacitor opening 15 during such removal/recessing, with material 80 also being removed back as shown. FIG. 12 shows subsequent removal of all remaining photoresist 80 (not shown) from capacitor opening 15. Such provides but one example embodiment of forming conductive lining 18 within capacitor opening 15 to have an uppermost surface 60 therein that is below an uppermost surface 17 of insulative-comprising material 52 immediately laterally adjacent capacitor opening 15. Alternate existing or yet-to-be-developed techniques may be used.

Figure 13:
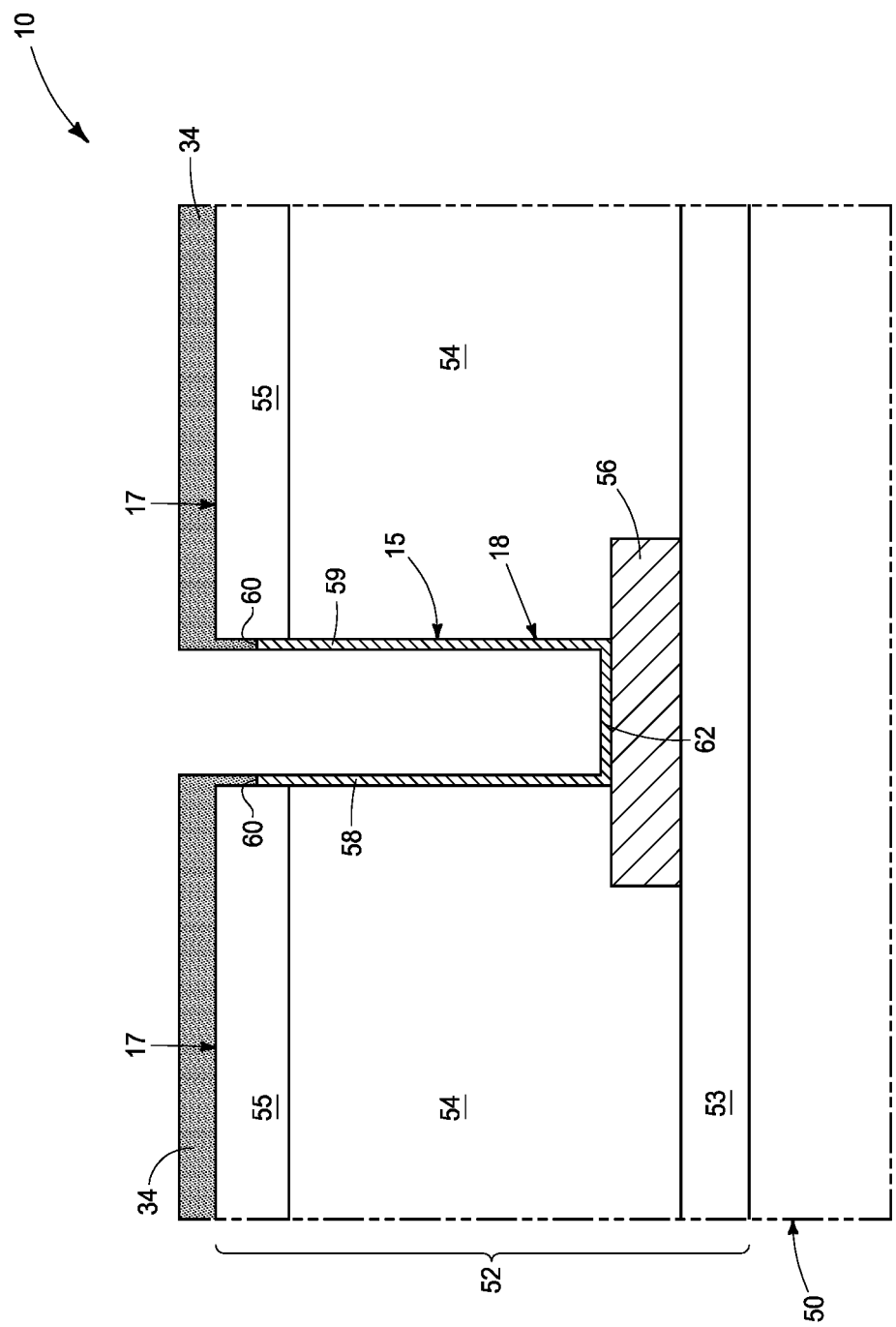
FIG. 13 is a view of the FIG. 12 construction at a processing step subsequent to that shown by FIG. 12.

Referring to FIG. 13, a current leakage lining 34 has been formed atop recessed conductive lining 18 within capacitor opening 15. In one embodiment and as shown, material of current leakage lining 34 extends outwardly of capacitor opening 15 and over uppermost surface 17 of insulative-comprising material 52. In one embodiment and as shown, current leakage lining 34 has been formed directly against conductive lining 18. In one embodiment, the forming of current leakage lining 34 may be conducted by PVD (physical vapor deposition) that forms material of current leakage lining 34 in an uppermost portion of capacitor opening 15 and not in a lowest portion of capacitor opening 15. Material of current leakage lining 34 may bulge laterally (not shown) toward a radial center of capacitor opening 15 (sometimes commonly known as a "bread-loafing" effect) and is not shown for simplicity in the drawings.

Figure 14:
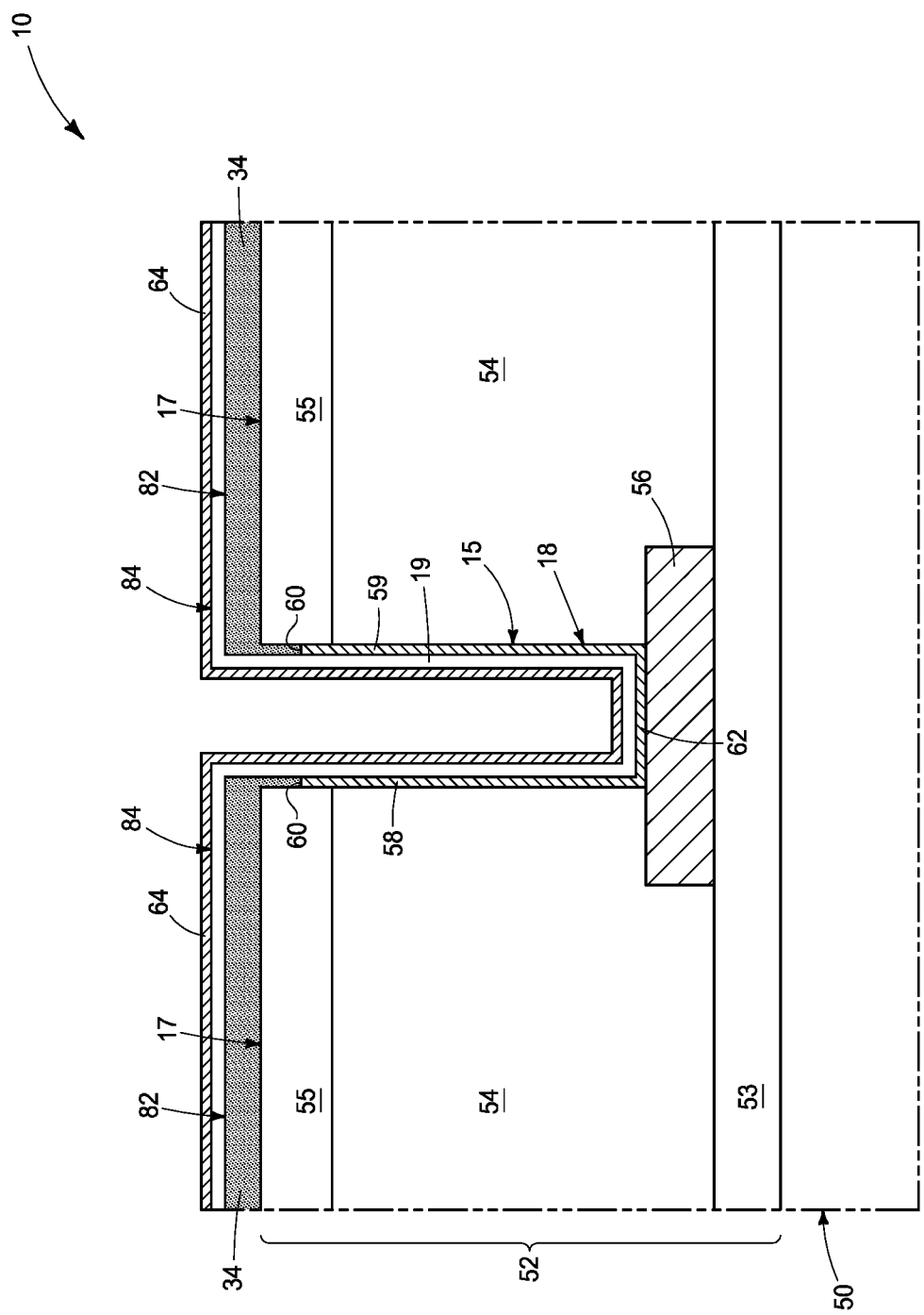
FIG. 14 is a view of the FIG. 13 construction at a processing step subsequent to that shown by FIG. 13.

Referring to FIG. 14, ferroelectric material 19 has been formed aside conductive lining 18 and current leakage lining 34 in capacitor opening 15, and which will comprise capacitor insulator material of the capacitor being formed. In one embodiment and as shown, ferroelectric material 19 extends outwardly of capacitor opening 15 and over an uppermost surface 82 of material of current leakage lining 34 laterally outward of capacitor opening 15. In one embodiment and as shown, ferroelectric material 19 is formed directly against current leakage lining 34 in capacitor opening 15. Conductive material 64 has been formed in capacitor opening 15 to comprise a second electrode of capacitor 14 being formed. In one embodiment and as shown, conductive material 64 extends outwardly of capacitor opening 15 over an uppermost surface 84 of ferroelectric material 19 that extends outwardly of capacitor opening 15.

Figure 15:
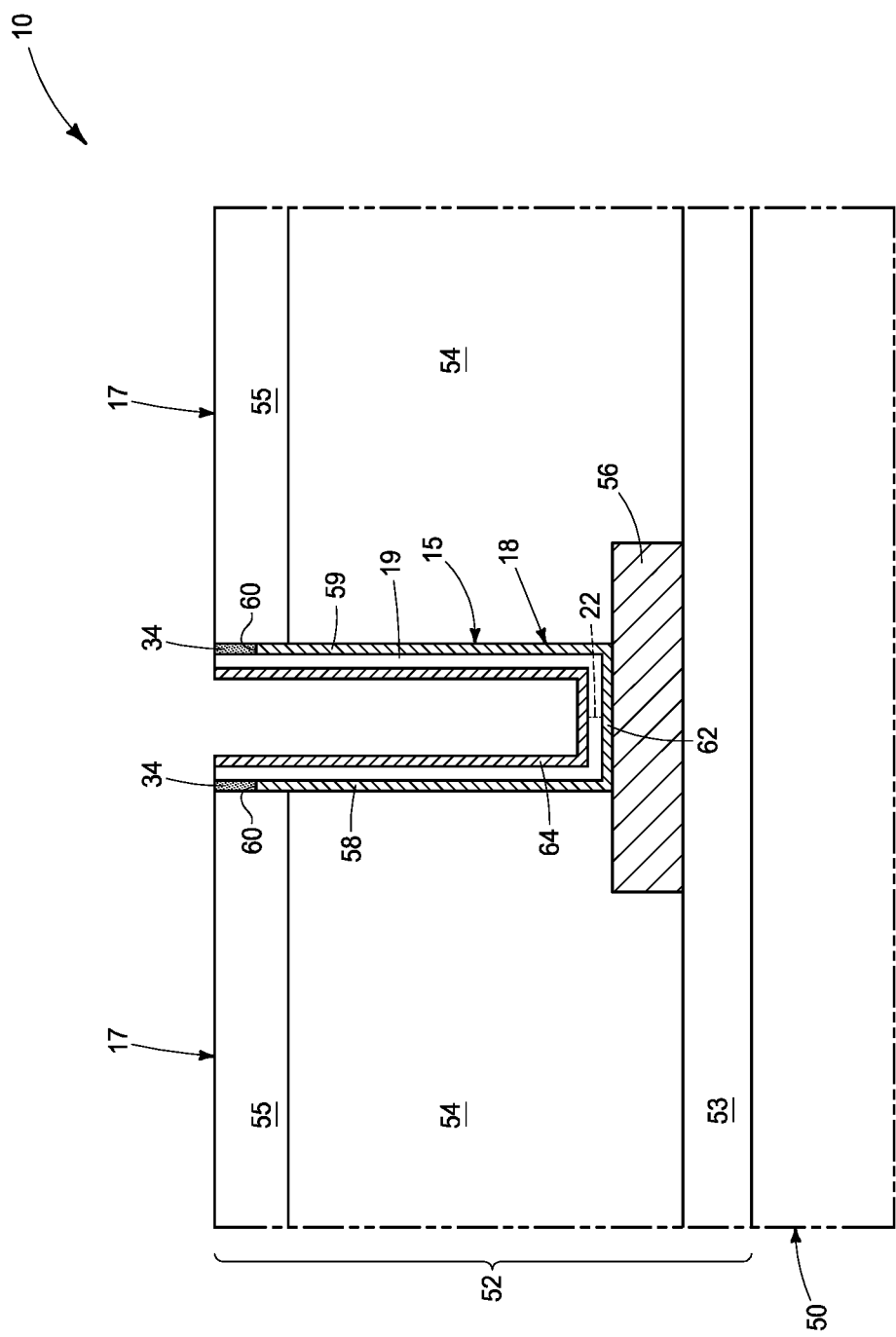
FIG. 15 is a view of the FIG. 14 construction at a processing step subsequent to that shown by FIG. 14.

Referring to FIG. 15, material of current leakage lining 34, ferroelectric material 19, and conductive material 64 that are laterally outward of capacitor opening 15 have been removed back at least to elevationally outermost surface 17 of insulative-comprising material 52.

Figure 16:
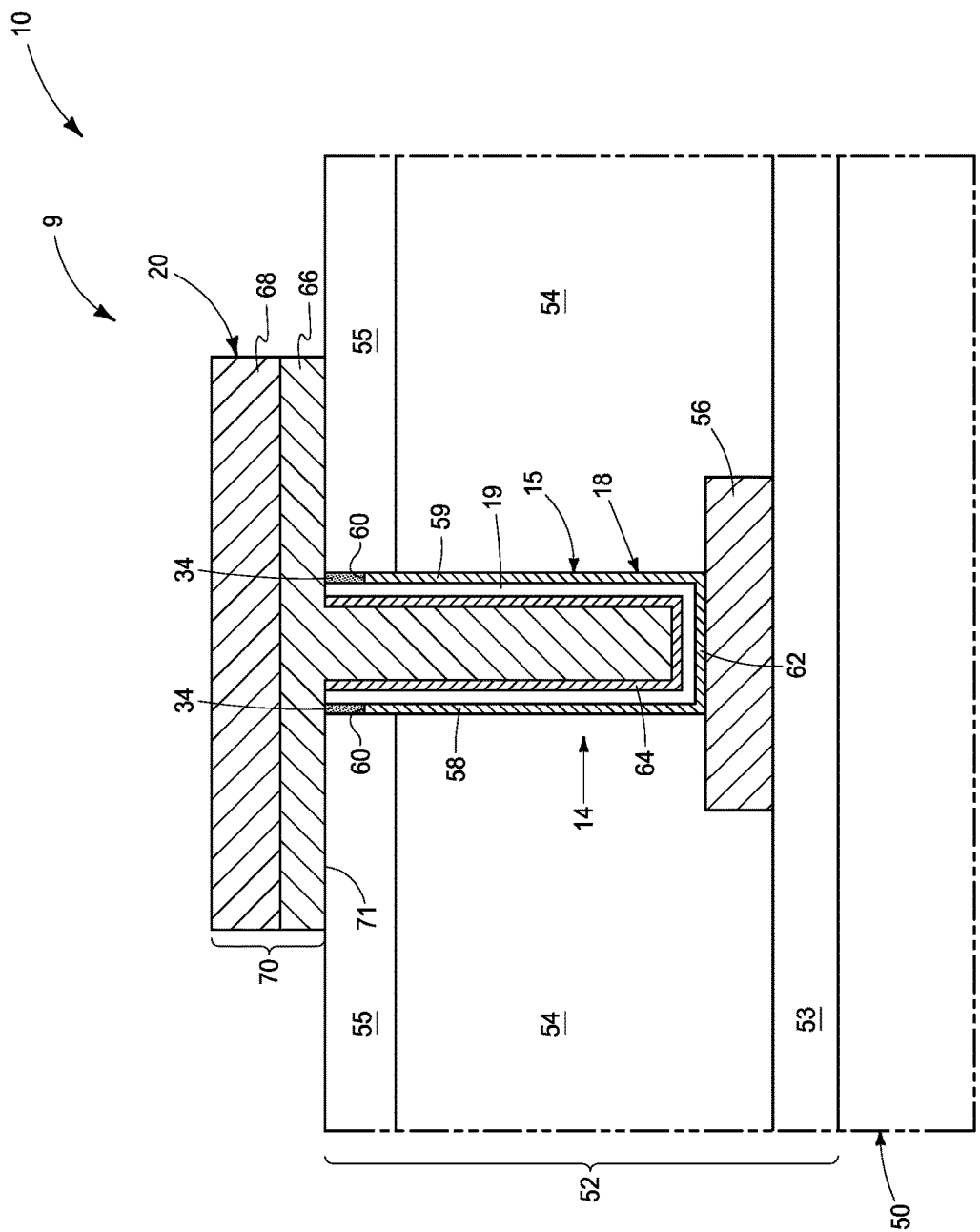
FIG. 16 is a view of the FIG. 15 construction at a processing step subsequent to that shown by FIG. 15.

Referring to FIG. 16, conductive material 66 and 68 are shown as having been subsequently deposited and patterned to produce the FIG. 16 construction (the same as that depicted in FIG. 2, but for the select device). Capacitor 14 comprises an intrinsic current leakage path (e.g., 22) from one of the first and second capacitor electrodes to the other through the ferroelectric material. The current leakage lining forms a parallel current leakage path 26 (FIGS. 2, 3, 5, and 6) that is circuit-parallel the intrinsic current leakage path and of lower total resistance than the intrinsic current leakage path, as described above. Any aspect of the method may encompass any of the features described above with respect to a memory cell construction.

Conclusion

In some embodiments, a memory cell comprises a capacitor having a first conductive capacitor electrode having laterally-spaced walls that individually have a top surface. A second conductive capacitor electrode is laterally between the walls of the first capacitor electrode, and comprises a portion above the first capacitor electrode. Ferroelectric material is laterally between the walls of the first capacitor electrode and laterally between the second capacitor electrode and the first capacitor electrode. The capacitor comprises an intrinsic current leakage path from one of the first and second capacitor electrodes to the other through the ferroelectric material. A parallel current leakage path is between an elevationally-inner surface of the portion of the second capacitor electrode that is above the first capacitor electrode and at least one of the individual top surfaces of the laterally-spaced walls of the first capacitor electrode. The parallel current leakage path is circuit-parallel the intrinsic current leakage path and of lower total resistance than the intrinsic current leakage path.

In some embodiments, a memory cell comprises a capacitor comprising a first conductive capacitor electrode and a second conductive capacitor electrode comprising a portion above the first capacitor electrode. Ferroelectric material is between the second capacitor electrode and the first capacitor electrode. The capacitor comprises an intrinsic current leakage path from one of the first and second capacitor electrodes to the other through the ferroelectric material. A parallel current leakage path is between the second capacitor electrode and the first capacitor electrode. The parallel current leakage path is circuit-parallel the intrinsic path, of lower total resistance than the intrinsic current leakage path, and comprises an annulus.

In some embodiments, a memory cell comprises a capacitor having a first conductive capacitor electrode and a second conductive capacitor electrode. Ferroelectric material is between the second capacitor electrode and the first capacitor electrode. The capacitor comprises an intrinsic current leakage path from one of the first and second capacitor electrodes to the other through the ferroelectric material. A circuit-parallel current leakage path is between the second capacitor electrode and the first capacitor electrode. The circuit-parallel current leakage path is circuit-parallel the intrinsic current leakage path and of lower total resistance than the intrinsic current leakage path. The circuit-parallel current leakage path is physically-parallel and alongside the ferroelectric material from a bottom surface to a top surface of material of the current leakage path.

In some embodiments, a method of forming a capacitor comprises forming a conductive lining in a capacitor opening in insulative-comprising material to comprise a first capacitor electrode of a capacitor being formed in the capacitor opening. The conductive lining has an uppermost surface within the capacitor opening that is below an uppermost surface of the insulative-comprising material immediately laterally adjacent the capacitor opening. A current leakage lining is formed atop the conductive lining within the capacitor opening. Ferroelectric material is formed aside the conductive lining and the current leakage lining in the capacitor opening. The ferroelectric material comprises capacitor insulator material of the capacitor. Conductive material is formed in the capacitor opening to comprise a second capacitor electrode of the capacitor. The capacitor comprises an intrinsic current leakage path from one of the first and second capacitor electrodes to the other through the ferroelectric material. The current leakage lining forms a parallel current leakage path that is circuit-parallel the intrinsic current leakage path and of lower total resistance than the intrinsic current leakage path.

In some embodiments, a method of forming a capacitor comprises forming a conductive lining in a capacitor opening in insulative-comprising material to comprise a first capacitor electrode of a capacitor being formed in the capacitor opening. Material of the conductive lining extends outwardly of the capacitor opening and over an uppermost surface of the insulative-comprising material. The capacitor opening with the conductive lining therein is plugged with photoresist. The photoresist and the material of the conductive lining extending outwardly of the capacitor opening over an uppermost surface of the insulative-comprising material are removed back at least to the uppermost surface of the insulative-comprising material. The conductive lining in the capacitor opening is elevationally recessed relative to the uppermost surface of the insulative-comprising material. All remaining of the photoresist is removed from the capacitor opening. After removing the photoresist, a current leakage lining is formed atop the recessed conductive lining within the capacitor opening. Material of the current leakage lining extends outwardly of the capacitor opening and over the uppermost surface of the insulative-comprising material. Ferroelectric material is formed aside the conductive lining and the current leakage lining in the capacitor opening. The ferroelectric material extends outwardly of the capacitor opening and over an uppermost surface of the material of the current leakage lining laterally outward of the capacitor opening. The ferroelectric material comprises capacitor insulator material of the capacitor. Conductive material is formed in the capacitor opening and extends laterally outwardly of the capacitor opening over an uppermost surface of the ferroelectric material laterally outward of the capacitor opening. The conductive material comprises a second capacitor electrode of the capacitor. The material of the current leakage lining, the ferroelectric material, and the conductive material that are laterally outward of the capacitor opening are removed back at least to the elevationally outermost surface of the insulative-comprising material. The capacitor comprises an intrinsic current leakage path from one of the first and second capacitor electrodes to the other through the ferroelectric material. The current leakage lining forms a parallel current leakage path that is circuit-parallel the intrinsic current leakage path and of lower total resistance than the intrinsic current leakage path.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell, comprising:
a capacitor comprising:
a first capacitor electrode having laterally-spaced walls that individually have a top surface;
a second capacitor electrode laterally between the walls of the first capacitor electrode, the second capacitor electrode comprising a portion above the first capacitor electrode; and
ferroelectric material laterally between the walls of the first capacitor electrode and laterally between the second capacitor electrode and the first capacitor electrode, the capacitor comprising an intrinsic current leakage path from one of the first and second capacitor electrodes to the other through the ferroelectric material; and
a parallel current leakage path between an elevationally-inner surface of the portion of the second capacitor electrode that is above the first capacitor electrode and at least one of the individual top surfaces of the laterally-spaced walls of the first capacitor electrode, the parallel current leakage path being circuit-parallel with the intrinsic current leakage path and of lower total resistance than the intrinsic current leakage path.

2. The memory cell of claim 1 wherein the first capacitor electrode comprises a bottom extending laterally to and between the laterally-spaced walls.

3. The memory cell of claim 1 wherein the elevationally-inner surface is an elevationally-innermost surface of the portion of the second capacitor electrode that is above the first capacitor electrode.

4. The memory cell of claim 1 wherein the parallel current leakage path is between the elevationally-inner surface and both top surfaces of the laterally-spaced walls of the first capacitor electrode.

5. The memory cell of claim 1 wherein the parallel current leakage path is configured so that current there-through when the memory cell is idle is no more than one nanoampere.

6. The memory cell of claim 1 wherein the parallel current leakage path has a dominant band gap of 0.4 eV to 5.0 eV.

7. The memory cell of claim 6 wherein the parallel current leakage path has a dominant band gap that is less than dominant band gap of the ferroelectric material.

8. The memory cell of claim 1 wherein, in operation, any voltage differential across the capacitor when idle is such that any electric field in the ferroelectric material is at least 20 times lower than the intrinsic coercive field of the ferroelectric material.

9. The memory cell of claim 1 wherein the parallel current leakage path comprises a non-linear resistor between the first and second capacitor electrodes exhibiting higher resistance at higher voltages than at lower voltages.

10. The memory cell of claim 1 wherein the parallel current leakage path has minimum length greater than minimum thickness of the ferroelectric material between the first and second capacitor electrodes.

11. The memory cell of claim 1 wherein the dominant band gap of the ferroelectric material is equal to or less than that of the parallel current leakage path.

12. The memory cell of claim 1 wherein the parallel current leakage path predominantly comprises one or more of amorphous silicon, polycrystalline silicon, and germanium.

13. The memory cell of claim 1 wherein the parallel current leakage path predominantly comprises one or more chalcogenides.

14. The memory cell of claim 1 wherein the parallel current leakage path predominantly comprises one or more of silicon-rich silicon nitride, silicon-rich silicon oxide, and intrinsically dielectric material doped with conductivity increasing dopants.

15. The memory cell of claim 1 wherein the parallel current leakage path where between the first and second capacitor electrodes is homogenous.

16. The memory cell of claim 1 wherein the parallel current leakage path where between the first and second capacitor electrodes is non-homogenous.

17. The memory cell of claim 1 wherein the parallel current leakage path is directly against the ferroelectric material.

18. The memory cell of claim 1 wherein the parallel current leakage path is not directly against the ferroelectric material.

19. The memory cell of claim 1 comprising a select device electrically coupled in series with the capacitor.

20. The memory cell of claim 19 wherein, in operation, the select device exhibits currents leakage when the memory cell is idle, the parallel current leakage path being configured so that current there-through when the memory cell is idle is greater than or equal to said current leakage of the select device when the memory cell is idle.

21. The memory cell of claim 20 wherein the parallel current leakage path is configured so that current there-through when the memory cell is idle is no more than one nanoampere.

22. A memory cell, comprising:
   a capacitor comprising:
      a first capacitor electrode;
      a second capacitor electrode comprising a portion above the first capacitor electrode; and
      ferroelectric material between the second capacitor electrode and the first capacitor electrode, the capacitor comprising an intrinsic current leakage path from one of the first and second capacitor electrodes to the other through the ferroelectric material; and
   a parallel current leakage path between the second capacitor electrode and the first capacitor electrode; the parallel current leakage path being circuit-parallel with the intrinsic current leakage path, of lower total resistance than the intrinsic current leakage path, and comprising an annulus.

23. The memory cell of claim 22 wherein the first capacitor electrode comprises an annulus.

24. The memory cell of claim 23 wherein the annulus of the first capacitor electrode is directly against material of the parallel current leakage path that is in the shape of the annulus of the parallel current leakage path.

25. The memory cell of claim 24 wherein a longitudinal end of the annulus of the first capacitor electrode and a longitudinal end of the annulus of the material of the parallel current leakage path are directly against one another.

26. The memory cell of claim 23 wherein the ferroelectric material comprises an annulus laterally inside the first electrode.

27. A memory cell, comprising:
   a capacitor comprising:
      a first capacitor electrode;
      a second capacitor electrode; and
      ferroelectric material between the second capacitor electrode and the first capacitor electrode, the capacitor comprising an intrinsic current leakage path from one of the first and second capacitor electrodes to the other through the ferroelectric material; and
   a circuit-parallel current leakage path between the second capacitor electrode and the first capacitor electrode, the circuit-parallel current leakage path being circuit-parallel with the intrinsic current leakage path and of lower total resistance than the intrinsic current leakage path, the circuit-parallel current leakage path being physically-parallel and alongside the ferroelectric material from a bottom surface to a top surface of material of the circuit-parallel current leakage path.

28. The memory cell of claim 27 wherein the circuit-parallel current leakage path is directly against the ferroelectric material.

29. The memory cell of claim 28 wherein the circuit-parallel current leakage path is directly against the ferroelectric material from the bottom surface to the top surface of the material of the circuit-parallel current leakage path.

* * * * *